US012810759B2

(12) United States Patent
Tseng et al.

(10) Patent No.: US 12,810,759 B2
(45) **Date of Patent: *Nov. 24, 2026**

(54) SHIFT REGISTER UNIT, GATE DRIVING CIRCUIT AND DISPLAY DEVICE

(71) Applicant: Everdisplay Optronics (Shanghai) Co., Ltd., Shanghai (CN)

(72) Inventors: Ying-Hsiang Tseng, Shanghai (CN); Lina Xiao, Shanghai (CN); Qi Wang, Shanghai (CN); Jie Liu, Shanghai (CN); Feng Tang, Shanghai (CN)

(73) Assignee: Everdisplay Optronics (Shanghai) Co., Ltd., Shanghai (CN)

( * ) Notice: Subject to any disclaimer, the term of this patent is extended or adjusted under 35 U.S.C. 154(b) by 148 days.

This patent is subject to a terminal disclaimer.

(21) Appl. No.: 18/873,751

(22) PCT Filed: Sep. 21, 2023

(86) PCT No.: PCT/CN2023/120238
§ 371 (c)(1),
(2) Date: Dec. 11, 2024

(87) PCT Pub. No.: WO2025/007429
PCT Pub. Date: Jan. 9, 2025

(65) Prior Publication Data

US 2026/0268822 A1 Sep. 10, 2026

(30) Foreign Application Priority Data

Jul. 5, 2023 (CN) ........................ 202310822472.4

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0267* (2013.01); *G09G 2310/0286* (2013.01); *G09G 2310/08* (2013.01)

(58) Field of Classification Search
CPC ........................... G09G 3/3677; G09G 3/3266
See application file for complete search history.

(56) References Cited

U.S. PATENT DOCUMENTS

| | | | | |
|---|---|---|---|---|
| 8,564,523 B2 | 10/2013 | Moon | | |
| 12,512,029 B1 * | 12/2025 | Kuang | .................... | G09G 3/20 |

(Continued)

FOREIGN PATENT DOCUMENTS

| | | |
|---|---|---|
| CN | 103198781 A | 7/2013 |
| CN | 104900268 A | 9/2015 |

(Continued)

OTHER PUBLICATIONS

International Search Report dated Dec. 14, 2023 of International Application No. PCT/CN2023/120238.

(Continued)

*Primary Examiner* — Sepehr Azari
(74) *Attorney, Agent, or Firm* — Qinghong Xu

(57) ABSTRACT

The disclosure provides a shift register unit, a gate driving circuit and a display device. The shift register unit includes an input circuit, a first control circuit, a second control circuit, a first output circuit, a second output circuit, a first capacitor, a second capacitor and a third capacitor; wherein the input circuit controls the potential of the first node and the second node, the first control circuit controls the potential of the third node, the second control circuit controls the potential of the fourth node, and the first capacitor is connected between the second node and the second voltage signal lead; the first node is connected to the second node (Continued)

through a switch transistor; the second capacitor is connected between the third node and the second clock signal lead; and the third capacitor is connected between the fourth node and the second voltage signal lead.

15 Claims, 9 Drawing Sheets

(56) References Cited

U.S. PATENT DOCUMENTS

| | | | | |
|---|---|---|---|---|
| 12,633,244 | B2 * | 5/2026 | Tseng | G09G 3/2092 |
| 2008/0013670 | A1 | 1/2008 | Lo et al. | |
| 2009/0303211 | A1 | 12/2009 | Hu | |
| 2010/0207968 | A1 * | 8/2010 | Kim | G09G 3/3266 345/691 |
| 2014/0111490 | A1 | 4/2014 | Lee | |
| 2014/0168048 | A1 | 6/2014 | Shao et al. | |
| 2015/0043703 | A1 | 2/2015 | Tan | |
| 2015/0255031 | A1 | 9/2015 | Cao et al. | |
| 2016/0266699 | A1 | 9/2016 | Zhao et al. | |
| 2018/0366067 | A1 | 12/2018 | Jang | |
| 2020/0258439 | A1 | 8/2020 | Li | |
| 2021/0074215 | A1 | 3/2021 | Park et al. | |
| 2021/0134213 | A1 | 5/2021 | Jang | |
| 2021/0193007 | A1 | 6/2021 | Cheng et al. | |
| 2021/0200351 | A1 | 7/2021 | Yang et al. | |
| 2021/0366402 | A1 * | 11/2021 | In | G09G 3/296 |
| 2022/0036788 | A1 * | 2/2022 | Shi | G09G 3/20 |
| 2022/0059001 | A1 | 2/2022 | Yuan | |
| 2022/0101774 | A1 * | 3/2022 | Lim | G09G 3/2092 |
| 2022/0114945 | A1 | 4/2022 | Wang | |
| 2023/0351941 | A1 * | 11/2023 | In | G09G 3/3233 |
| 2024/0321214 | A1 * | 9/2024 | Chung | G09G 3/3266 |
| 2025/0029563 | A1 * | 1/2025 | Guo | G09G 3/20 |
| 2025/0095590 | A1 * | 3/2025 | Chen | G09G 3/3266 |
| 2026/0105877 | A1 * | 4/2026 | Tseng | G09G 3/2092 |

FOREIGN PATENT DOCUMENTS

| | | | | |
|---|---|---|---|---|
| CN | 106960655 A | | 7/2017 | |
| CN | 108399887 A | | 8/2018 | |
| CN | 109147635 A | | 1/2019 | |
| CN | 105741749 B | | 3/2019 | |
| CN | 109616056 A | | 4/2019 | |
| CN | 110164352 A | | 8/2019 | |
| CN | 111145823 A | | 5/2020 | |
| CN | 111754915 A | | 10/2020 | |
| CN | 111883067 A | | 11/2020 | |
| CN | 111933083 A | | 11/2020 | |
| CN | 112687229 A | | 4/2021 | |
| CN | 112687230 A | | 4/2021 | |
| CN | 112802422 A | | 5/2021 | |
| CN | 112951163 A | | 6/2021 | |
| CN | 113838408 A | | 12/2021 | |
| CN | 114495829 A | * | 5/2022 | G09G 3/3266 |
| CN | 115148140 A | * | 10/2022 | G09G 3/3233 |
| CN | 115881011 A | | 3/2023 | |
| CN | 116229904 A | | 6/2023 | |
| CN | 116805470 A | | 9/2023 | |
| JP | 2015060100 A | | 3/2015 | |
| KR | 20230009254 A | | 1/2023 | |
| WO | 2023028749 A1 | | 3/2023 | |

OTHER PUBLICATIONS

International Search Report dated Mar. 20, 2024 of International Application No. PCT/CN2023/120004.

1st Office Action dated Nov. 26, 2025 of Chinese Application No. 202310820939.1.

2nd Office Action dated May 29, 2026 of Chinese Application No. 202310820939.1.

Notice of Allowance dated Mar. 4, 2026 of U.S. Appl. No. 18/698,031.

* cited by examiner

SHIFT REGISTER UNIT, GATE DRIVING CIRCUIT AND DISPLAY DEVICE

CROSS REFERENCE

The present application is a national phase application of International Application No. PCT/CN2023/120238, filed on Sep. 21, 2023, which is based upon and claims priority to Chinese Application No. 202310822472.4, filed on Jul. 5, 2023, and the entire contents thereof are incorporated herein by reference.

TECHNICAL FIELD

The present disclosure relates to the field of display technology, and in particular to a shift register unit, a gate driving circuit and a display device.

BACKGROUND

A display device includes not only a display panel, but also a gate driving circuit (also referred to as a row driving circuit) and a source driving circuit (also referred to as a column driving circuit, Source Driver) that controls the display of the display panel having a pixel array. The display panel adopts a progressive scanning display mode, in which the gate driving circuit is used to generate scanning signals to turn on each row of pixels in turn, and the source driving circuit is used to provide data signals to a row of pixels when they are turned on to realize the display of the pixels.

The gate driving circuit includes a shift register, which includes multiple cascaded shift register units. Each stage of the shift register unit is usually mainly formed of several transistors. By inputting a clock signal and an input signal (i.e., the starting pulse signal) to the circuit, a level signal is outputted at the output end.

It should be noted that, information disclosed in the above background portion is provided only for better understanding of the background of the present disclosure, and thus it may contain information that does not form the prior art known by those ordinary skilled in the art.

SUMMARY

The present disclosure provides a shift register unit, a gate driving circuit and a display device.

An embodiment of the present disclosure provides a shift register unit, including:

- an input module, configured to transmit an input signal of an input end to a first node and a second node in response to a first clock signal;
- a first control module, configured to transmit a first voltage signal to a third node in response to the first clock signal; and transmit the first clock signal to the third node in response to a signal of the input end;
- a second control module configured to transmit the first voltage signal to a fourth node in response to a second clock signal; and transmit a second voltage signal to the fourth node in response to a signal of the first node;
- a first output module, configured to transmit the second voltage signal to the output end in response to a signal of the fourth node;
- a second output module, configured to transmit the first voltage signal to the output end in response to the signal of the first node;

- a first capacitor, connected between the second node and a second voltage signal lead; the first node and the second node are connected through a switch transistor;
- a second capacitor, connected between the third node and a second clock signal lead; and
- a third capacitor, connected between the fourth node and the second voltage signal lead.

In some embodiments, the input module includes a first transistor and a second transistor, a control end of the first transistor is connected to a first clock signal lead, a first end of the first transistor is connected to the input end, and a second end of the first transistor is connected to a first end of the second transistor; and

- a control end of the second transistor is connected to a first voltage signal lead, and the second end of the second transistor is connected to the first node.

In some embodiments, the input module further includes a third transistor and a fourth transistor, a control end of the third transistor is connected to the second clock signal lead, a first end of the third transistor is connected to the second voltage signal lead, and a second end of the third transistor is connected to a first end of the fourth transistor; and

- a control end of the fourth transistor is connected to the third node, and a second end of the fourth transistor is connected to the first end of the second transistor.

In some embodiments, the input module further includes a fifth transistor and a sixth transistor, the switch transistor is the sixth transistor, a control end of the fifth transistor is connected to the first clock signal lead, a first end of the fifth transistor is connected to the input end, and the second end of the fifth transistor is connected to the second node; and

- a control end of the sixth transistor is connected to the second node, a first end of the sixth transistor is connected to the second node, and a second end of the sixth transistor is connected to the first node.

In some embodiments, the input module further includes a seventh transistor, a control end of the seventh transistor is connected to the first voltage signal lead, a first end of the seventh transistor is connected to the second end of the fifth transistor, and a second end of the seventh transistor is connected to the second node.

In some embodiments, the input module further includes an eighth transistor, a control end of the eighth transistor is connected to the third node, a first end of the eighth transistor is connected to the second voltage signal lead, and a second end of the eighth transistor is connected to a first end of the first capacitor.

In some embodiments, the input module further includes a ninth transistor, a control end of the ninth transistor is connected to the second node, a first end of the ninth transistor is connected to the second clock signal lead, and a second end of the ninth transistor is connected to the first end of the first capacitor.

In some embodiments, the first control module includes a tenth transistor, a control end of the tenth transistor is connected to the first clock signal lead, a first end of the tenth transistor is connected to the first voltage signal lead, and a second end of the tenth transistor is connected to the third node.

In some embodiments, the first control module further includes an eleventh transistor, a control end of the eleventh transistor is connected to the input end, a first end of the eleventh transistor is connected to the first clock signal lead, and a second end of the eleventh transistor is connected to the third node.

In some embodiments, the first control module further includes a twelfth transistor, a control end of the twelfth transistor is connected to the first voltage signal lead, a first end of the twelfth transistor is connected to the third node, and a second end of the twelfth transistor is connected to a second end of the second capacitor.

In some embodiments, the second control module includes a thirteenth transistor and a fourteenth transistor, a control end of the thirteenth transistor is connected to a first end of the second capacitor and is connected to the second clock signal lead, a first end of the thirteenth transistor is connected to the first voltage signal lead, and a second end of the thirteenth transistor is connected to a first end of the fourteenth transistor; and a control end of the fourteenth transistor is connected to a second end of the second capacitor, and a second end of the fourteenth transistor is connected to the fourth node.

In some embodiments, the second control module further includes a fifteenth transistor, a control end of the fifteenth transistor is connected to the first node, a first end of the fifteenth transistor is connected to the second voltage signal lead, and a second end of the fifteenth transistor is connected to the fourth node.

In some embodiments, the first output module includes a sixteenth transistor, a control end of the sixteenth transistor is connected to the fourth node, a first end of the sixteenth transistor is connected to the second voltage signal lead, and a second end of the sixteenth transistor is connected to the output end; and the second output module includes a seventeenth transistor, a control end of the seventeenth transistor is connected to the first node, a first end of the seventeenth transistor is connected to a first voltage signal lead, and a second end of the seventeen transistors is connected to the output end.

Embodiments of the present disclosure further provides a gate driving circuit which includes the above shift register unit.

Embodiments of the present disclosure further provides a display device which includes the above gate driving circuit.

It is to be understood that both the foregoing general description and the following detailed description are exemplary and explanatory only and are not restrictive of the present disclosure.

BRIEF DESCRIPTION OF THE DRAWINGS

Other features, objectives and advantages of the present disclosure will become more apparent from a reading of the detailed description of non-limiting embodiments made with reference to the following accompanying drawings.

DETAILED DESCRIPTION

Figure 1:
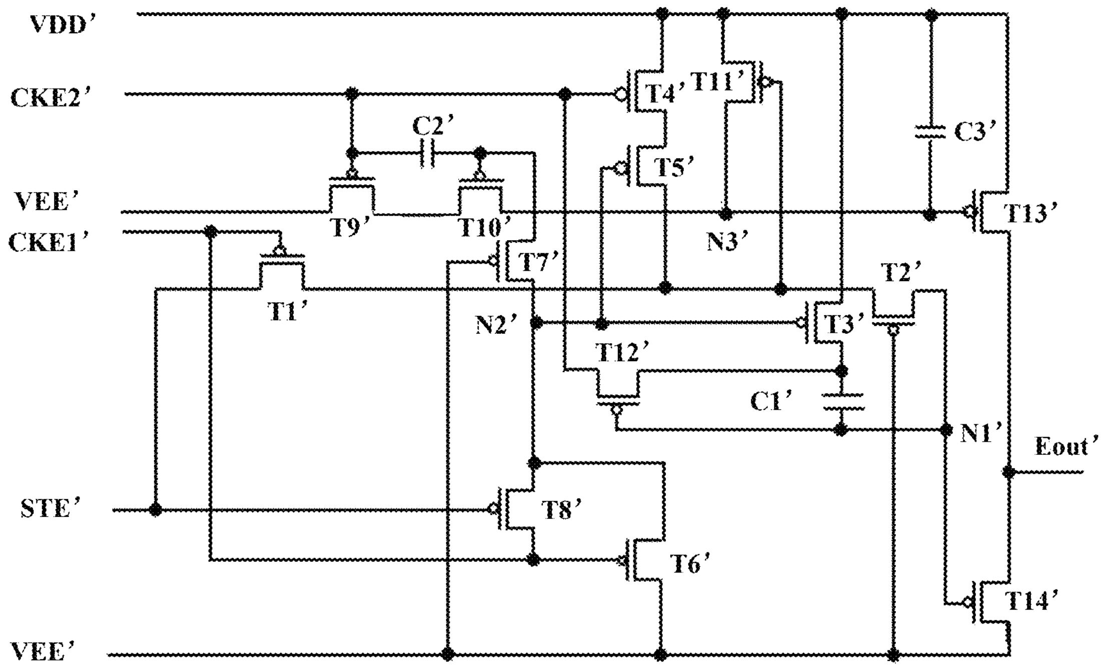
FIG. 1 is a schematic diagram of a shift register unit in the comparison embodiment.

Example embodiments will now be described more fully with reference to the accompanying drawings. Example embodiments may, however, be embodied in various forms and should not be construed as limited to the embodiments set forth herein; rather, these embodiments are provided so that this disclosure will be thorough and complete, and will fully convey the concepts of the example embodiments to those skilled in the art. The same reference numerals in the drawings represent the same or similar structures, and thus their repeated description will be omitted. The words "or" and "alternatively" in the description both can mean "and" or "or".

In this specification, reference to the terms "one embodiment," "some embodiments," "an example," "a specific example," or "some examples" or the like is intended to indicate that a specific feature, structure, material or characteristic in conjunction with the embodiment is included in at least one embodiment or example of the present application. Furthermore, the specific feature, structure, material, or characteristic shown may be combined in any suitable manner in any one or more embodiments or examples. Furthermore, those skilled in the art may joint and combine the different embodiments or examples represented in this application and the features of the different embodiments or examples, unless they contradict each other.

In addition, the terms "first" and "second" are only used for expression purposes and cannot be understood as indicating or implying relative importance or implicitly indicating the number of indicated technical features. Thus, features defined as "first" and "second" may explicitly or implicitly include at least one of these features. In the expressions in this application, "plurality" means two or more than two, unless otherwise expressly and specifically limited.

The transistors used in the embodiments of the present disclosure may be thin film transistors, field effect transistors, or other devices with the same characteristics. Transistors can be classified into N-type and P-type according to their characteristics. In the following embodiments, P-type transistors are used for explanation. In the embodiment of the present disclosure, the control end is the gate, the first end is the source, and the second end is the drain. When the gate of the P-type transistor inputs a low level, the source and drain are turned on. It should be noted here that in the embodiment of the present disclosure, all transistors are P-type transistors as an example. The operating level refers to the effective level at which the P-type transistors are turned on, that is, the low level. The non-operating level is the high level.

Figure 2:
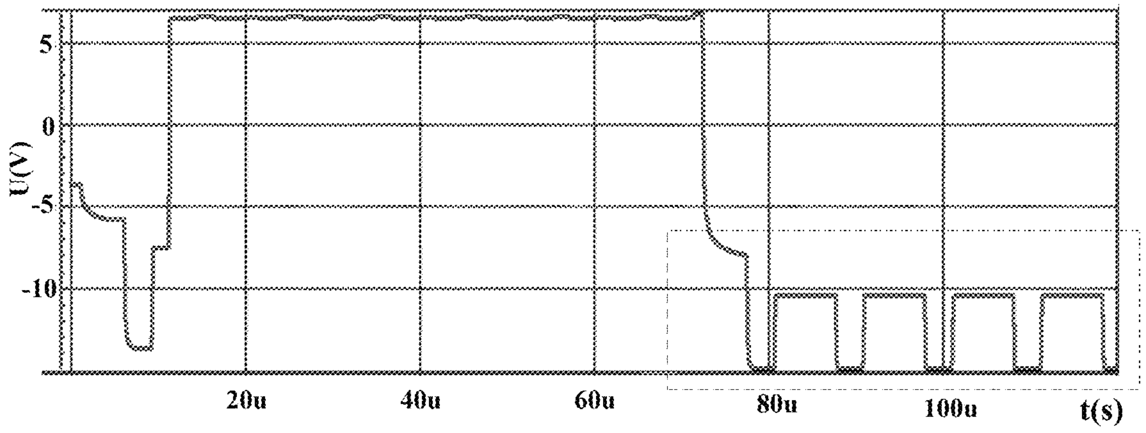
FIG. 2 is a voltage waveform diagram of the first node N1' of the shift register unit in FIG. 1.
Figure 3:
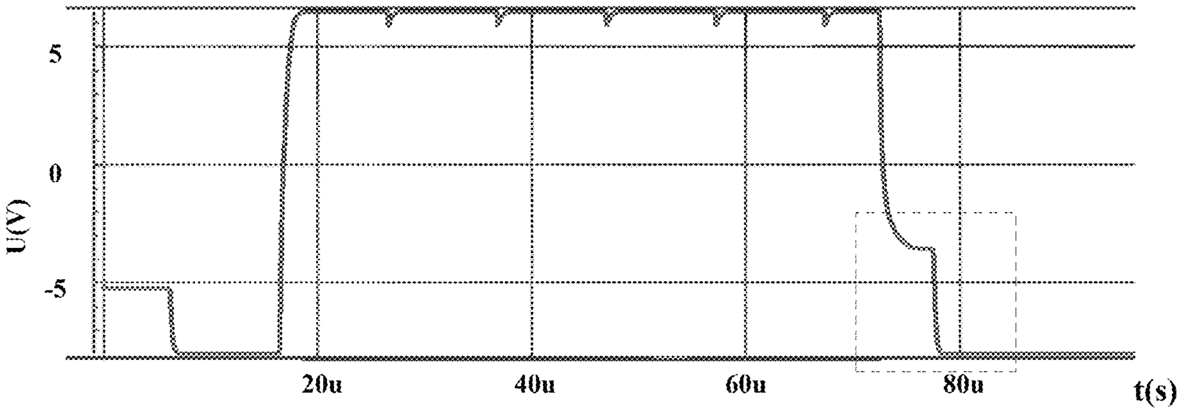
FIG. 3 is a voltage waveform diagram of the output end of the shift register unit in FIG. 1.

FIG. 1 shows a schematic diagram of a shift register unit in a comparison embodiment; FIG. 2 shows the voltage waveform diagram of the first node N1' in FIG. 1 during operation, in which the abscissa is time and the ordinate is voltage; and FIG. 3 shows the voltage signal output by the output end of the shift register unit in FIG. 1, in which the abscissa is time and the ordinate is voltage. As shown in FIG. 1, the existing shift register unit includes transistors T1'~T14' and capacitors C1'~C3', in which nodes N1'~N3' are formed, and signals VDD', CKE2', VEE', CKE1', STE' respectively represents the second voltage signal, the second clock signal, the first voltage signal, the first clock signal, and the input signal. According to FIGS. 1 to 3, when the signal of the first node N1' changes from high level to low level, under the action of the first capacitor C1', there will be the waveform of high and low oscillations as shown in the dotted line box in FIG. 2, and the high and low oscillation that occurs at the first node N1' will cause the output end to appear a step as shown in the dotted box in FIG. 3 when the output high-level signal changes to a low-level signal. The occurring of the step may cause the shift register to output signal that is still at a valid level, so that the pixel circuit controlled by the shift register unit cannot be turned off in time.

Figure 4:
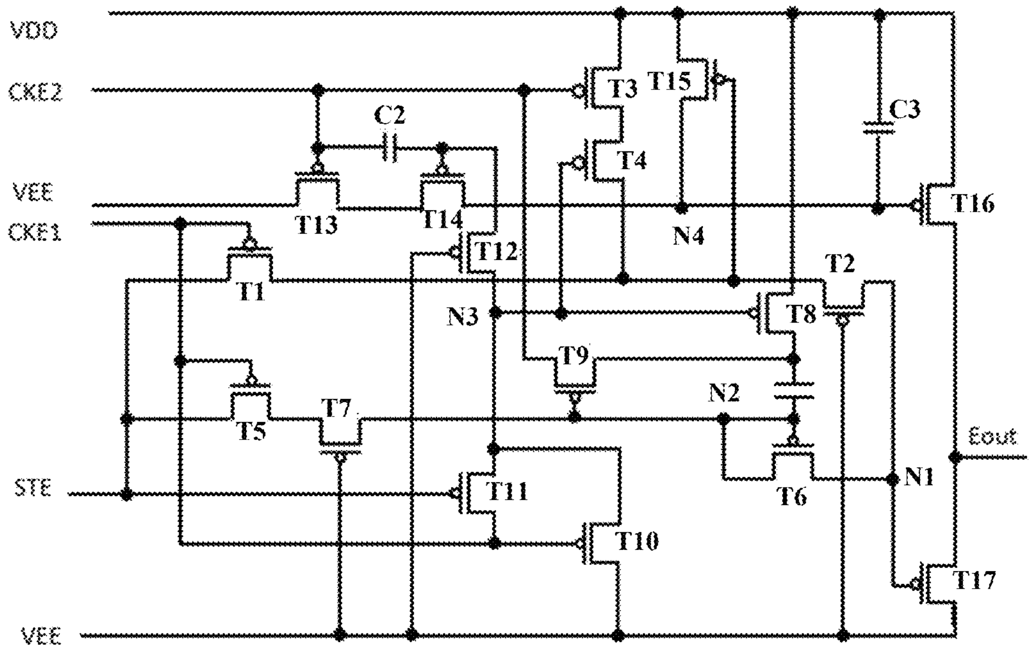
FIG. 4 is a schematic diagram of a shift register unit provided in an embodiment of the present disclosure.

In order to solve the problems of the comparison embodiment, the present disclosure provides a shift register unit, as shown in FIG. 4. The shift register unit includes:

an input module, configured to transmit an input signal STE of an input end to a first node N1 and a second node N2 in response to a first clock signal CKE1;

a first control module, configured to transmit a first voltage signal VEE to a third node N3 in response to the first clock signal CKE1; and transmit the first clock signal CKE1 to the third node N3 in response to a signal of the input end;

a second control module configured to transmit the first voltage signal VEE to a fourth node N4 in response to a second clock signal CKE2; and transmit a second voltage signal VDD to the fourth node N4 in response to a signal of the first node N1;

a first output module, configured to transmit the second voltage signal VDD to the output end in response to a signal of the fourth node N4;

a second output module, configured to transmit the first voltage signal VEE to the output end in response to the signal of the first node N1;

a first capacitor C1, connected between the second node N2 and a second voltage signal lead; the first node N1 and the second node N2 are connected through a switch transistor;

a second capacitor C2, connected between the third node N3 and a second clock signal lead; and a third capacitor C3, connected between the fourth node N4 and the second voltage signal lead.

Please continue to refer to FIG. 4. Specifically, the input module includes a first transistor T1 and a second transistor T2. The control end of the first transistor T1 is connected to the first clock signal lead. The first end of the first transistor T1 is connected to the input end, and the second end of the first transistor T1 is connected to the first end of the second transistor T2;

The control end of the second transistor T2 is connected to the first voltage signal lead, and the second end of the second transistor T2 is connected to the first node N1.

The input module further includes a third transistor T3 and a fourth transistor T4. The control end of the third transistor T3 is connected to the second clock signal lead. The first end of the third transistor T3 is connected to the second voltage signal lead, and the second end of the third transistor T3 is connected to the first end of the fourth transistor T4. The control end of the fourth transistor T4 is connected to the third node N3, and the second end of the fourth transistor T4 is connected to the first end of the second transistor T2.

The input module further includes a fifth transistor T5 and a sixth transistor T6. The switch transistor is the sixth transistor T6. The control end of the fifth transistor T5 is connected to the first clock signal lead. The first end of the fifth transistor T5 is connected to the input end, and the second end of the fifth transistor T5 is connected to the second node N2. The control end of the sixth transistor T6 is connected to the second node N2, the first end of the sixth transistor T6 is connected to the second node N2, and the second end of the sixth transistor T6 is connected to the first node N1.

The input module further includes a seventh transistor T7. The control end of the seventh transistor T7 is connected to the first voltage signal lead. The first end of the seventh transistor T7 is connected to the second end of the fifth transistor T5. The second end of the seventh transistor T7 is connected to the second node N2.

The input module further includes an eighth transistor T8. The control end of the eighth transistor T8 is connected to the third node N3. The first end of the eighth transistor T8 is connected to the second voltage signal lead. The second end of the eighth transistor T8 is connected to the first end of the first capacitor.

The input module further includes a ninth transistor T9. The control end of the ninth transistor T9 is connected to the second node N2. The first end of the ninth transistor T9 is connected to the second clock signal lead. The second end of the ninth transistor T9 is connected to the first end of the first capacitor.

The first control module includes a tenth transistor T10, a control end of the tenth transistor T10 is connected to the first clock signal lead, a first end of the tenth transistor T10 is connected to the first voltage signal lead, and a second end of the tenth transistor T10 is connected to the third node N3.

The first control module further includes an eleventh transistor, the control end of the eleventh transistor T11 is connected to the input end, the first end of the eleventh transistor T11 is connected to the first clock signal lead, and the second end of the eleventh transistor T11 is connected to the third node N3.

The first control module further includes a twelfth transistor T12. The control end of the twelfth transistor T12 is connected to the first voltage signal lead. The first end of the twelfth transistor T12 is connected to the third node N3, and the second end of the twelfth transistor T12 is connected to the second end of the second capacitor.

The second control module includes a thirteenth transistor T13 and a fourteenth transistor T14. The control end of the thirteenth transistor T13 is connected to the first end of the second capacitor and to the second clock signal lead, the first end of the thirteenth transistor T13 is connected to the first voltage signal lead, and the second end of the thirteenth transistor T13 is connected to the first end of the fourteenth transistor T14. The control end of the fourteenth transistor T14 is connected to the second end of the second capacitor, and the second end of the fourteenth transistor T14 is connected to the fourth node.

The second control module further includes a fifteenth transistor T15. The control end of the fifteenth transistor T15 is connected to the first node N1. The first end of the fifteenth transistor T15 is connected to the second voltage signal lead, and the second end of the fifteenth transistor T15 is connected to the fourth node.

The first output module includes a sixteenth transistor T16, a control end of the sixteenth transistor T16 is connected to the fourth node, a first end of the sixteenth transistor T16 is connected to the second voltage signal lead, the second end of the sixteenth transistor T16 is connected to the output end.

The second output module includes a seventeenth transistor T17. The control end of the seventeenth transistor T17 is connected to the first node N1. The first end of the seventeenth transistor T17 is connected to the first voltage signal lead, and the second end of the seventeenth transistor T17 is connected to the output end.

Figure 5:
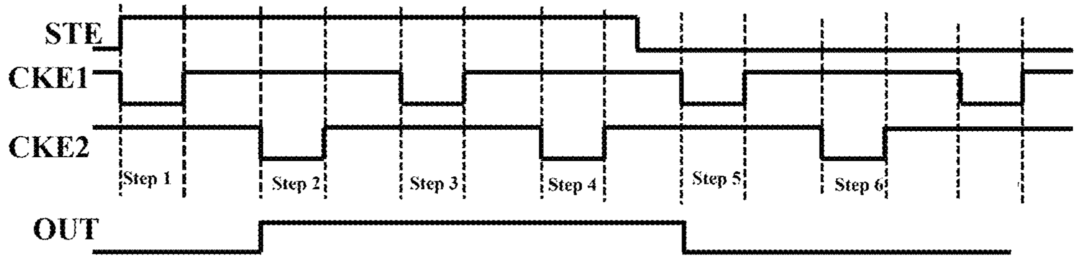
FIG. 5 is a timing diagram of a shift register unit provided in one embodiment of the present disclosure.

FIG. 5 shows a timing diagram of a shift register unit provided by an embodiment of the present disclosure. The operating principle of the shift register unit provided by the embodiment of the present disclosure will be explained with reference to FIG. 4. It should be noted that, for the convenience of understanding, high-level signals are represented by "H" and low-level signals are represented by "L" in the drawings.

Figure 6:
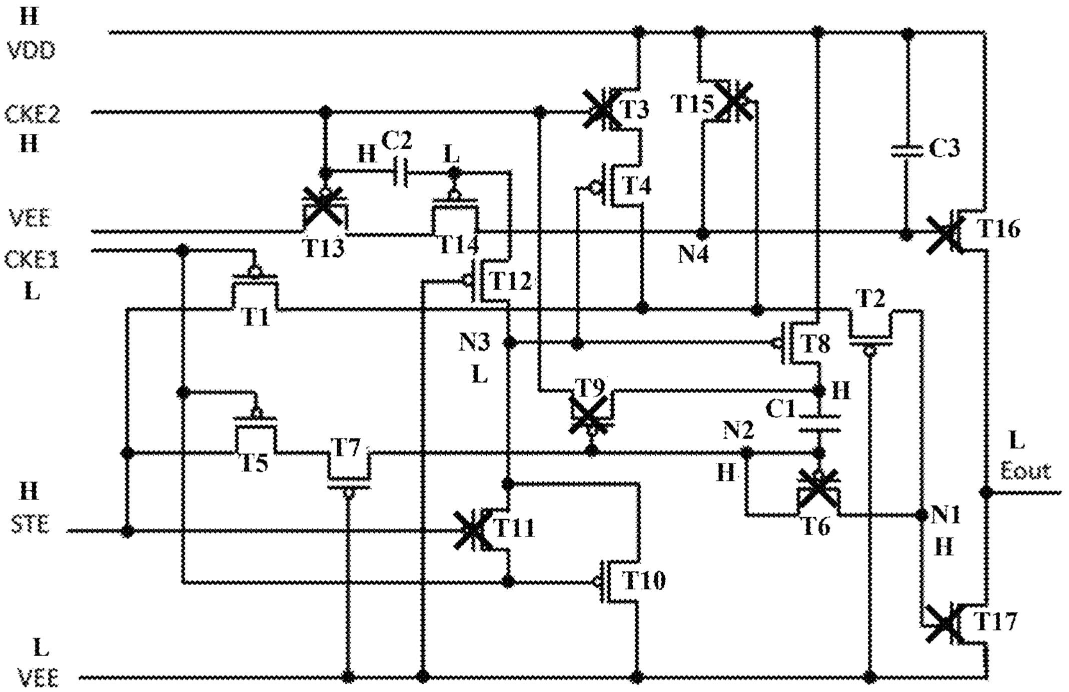
FIGS. 6 to 11 are schematic diagrams of the on/off of the circuit in the shift register unit when the shift register unit according to an embodiment of the present disclosure is operated in the first step Step1 to the sixth step Step6.

FIG. 6 shows a schematic diagram of controlling the on/off of the circuit in the shift register unit during the first operation step Step1. As shown in FIG. 6, during the operation of Step1, the input signal STE is high level, the first clock signal CKE1 is low level, the second clock signal CKE2 is high level, the first voltage signal VEE is a continuous low-level signal, and the second voltage signal VDD is a continuous high-level signal. Under the action of the input signal STE being at a high level, the eleventh transistor T11 is turned off; under the action of the first clock signal CKE1 being at a low level, the first transistor T1, the fifth transistor T5 and the tenth transistor T10 are turned on; under the action of the low level of the first voltage signal VEE, the second transistor T2, the seventh transistor T7 and the twelfth transistor T12 are continuously turned on. In the following stages, the reason for turning on the second transistor T2, the seventh transistor T7 and the twelfth transistor T12 will not be explained again. The input signal STE is transmitted to the first node N1 through the first transistor T1 and the second transistor T2. The first node N1 is at a high level at this time. Under the action of the first node N1 being at a high level, the fifteenth transistor T15 and the seventeenth transistor T17 are turned off. The input signal STE is transmitted to the second node N2 through the fifth transistor T5 and the seventh transistor T7. At this time, the second node N2 is at a high level; and under the action of the high level of the second node N2, the sixth transistor T6 and the ninth transistor T9 are turned off. The first voltage signal VEE is transmitted to the third node N3 through the tenth transistor T10, and is transmitted to the second end of the second capacitor C2 through the twelfth transistor T12. At this time, the second end of the second capacitor C2 is a low-level signal. When the third node N3 is at a low level, the fourth transistor T4, the eighth transistor T8 and the fourteenth transistor T14 are turned on. The second voltage signal VDD is transmitted to the first end of the first capacitor C1 through the eighth transistor T8. Under the action of the second clock signal CKE2 being at a high level, the third transistor T3 and the thirteenth transistor T13 are turned off, and the second clock signal CKE2 is transmitted to the first end of the second capacitor C2. At this time, the second capacitor C2 is charged. The first end of the second capacitor C2 is at a high level, and the second end of the second capacitor C2 is at a low level. The fourth node N4 does not transmit a new level signal at this time, the potential of the fourth node N4 maintains the same high-level signal as the previous moment, and the sixteenth transistor T16 remains in the off state. Therefore, during the operation of Step1, the sixteenth transistor T16 and the seventeenth transistor T17 are turned off, and the output end of the shift register unit maintains the low-level signal output at the previous moment.

Figure 7:
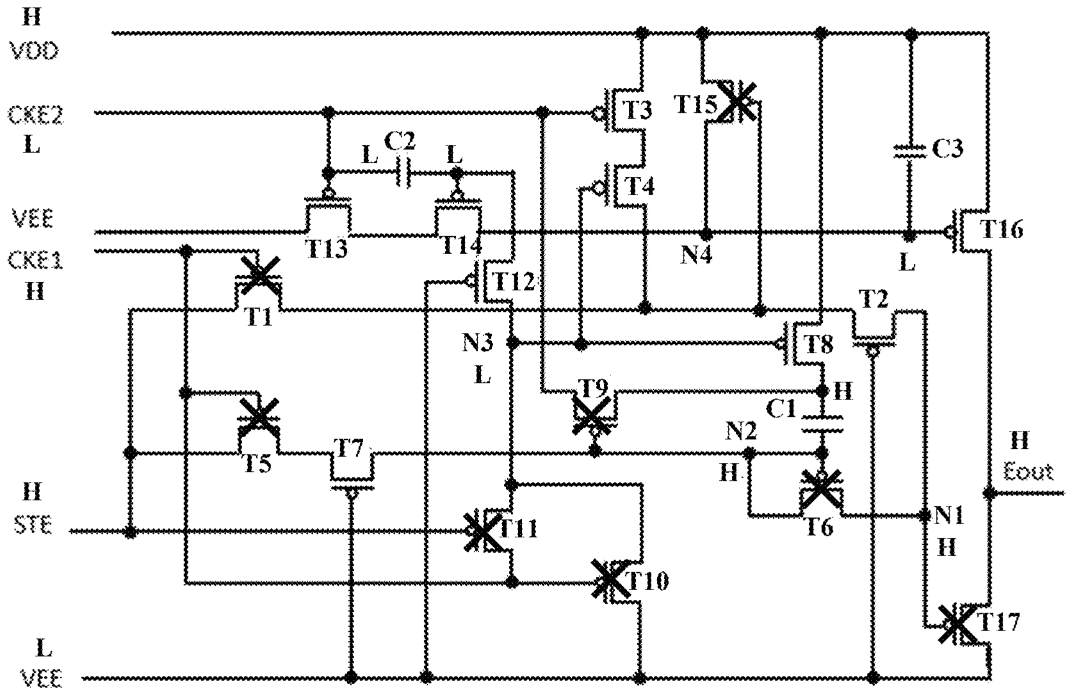

FIG. 7 shows a schematic diagram of controlling the on/off of the circuit in the shift register unit during the second operation step Step2. As shown in FIG. 7, during the operation of Step2, the input signal STE is high level, the first clock signal CKE1 is high level, the second clock signal CKE2 is low level, the first voltage signal VEE is a continuous low-level signal, and the second voltage signal VDD is a continuous high-level signal, then the first transistor T1, the fifth transistor T5, the tenth transistor T10, and the eleventh transistor T11 are turned off, and the third transistor T3 and the thirteenth transistor T13 are turned on. Under the action of the second capacitor C2, the fourteenth transistor T14 is turned on, and the signal of the third node N3 is low level, then the fourth transistor and the eighth transistor T8 are turned on. The second voltage signal VDD is transmitted to the first end of the first capacitor C1 through the eighth transistor T8. The second voltage signal VDD is transmitted to the first node N1 through the third transistor T3, the fourth transistor T4 and the second transistor T2. The signal at the first node N1 is high level VDD, then the fifteenth transistor T15 and the seventeenth transistor T17 are turned off. The first voltage signal VEE is transmitted to the fourth node N4 through the thirteenth transistor T13 and the fourteenth transistor T14. The potential of the fourth node N4 is the low-level VEE, and the third capacitor C3 is charged. Under the action of the low-level signal of the fourth node N4, the sixteenth transistor T16 is turned on, the second voltage signal VDD is transmitted to the output end through the sixteenth transistor T16, and the output signal Eout is the high-level VDD. Therefore, during the operation of Step2, the output end of the shift register unit outputs the high-level second voltage signal VDD.

Figure 8:
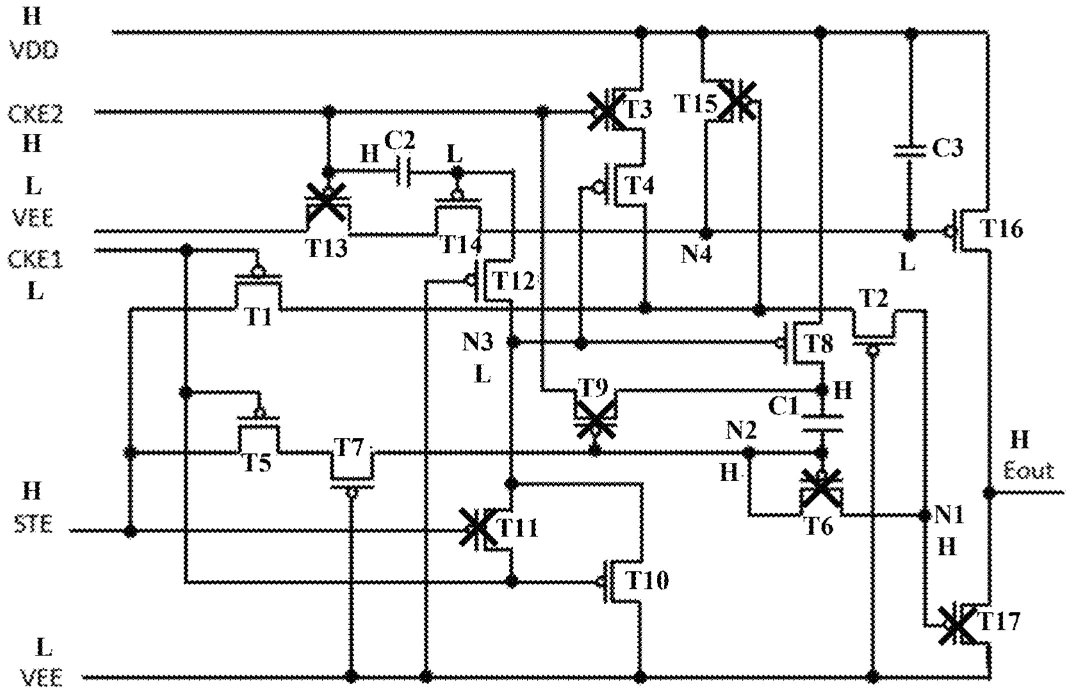

FIG. 8 shows a schematic diagram of controlling the on/off of the circuit in the shift register unit during the third operation step Step3. As shown in FIG. 8, during the operation of Step3, the input signal STE is high level, the first clock signal CKE1 is low level, and the second clock signal CKE2 is high level, then the first transistor, the fifth transistor T5, and the tenth transistor T10 are turned on, and the eleventh transistor T11 and the thirteenth transistor T13 are turned off. The input signal STE is transmitted to the first node N1 through the first transistor T1 and the second transistor T2. At this time, the signal of the first node N1 is high level, and then the fifteenth transistor T15 and the seventeenth transistor T17 are turned off. The input signal STE is transmitted to the second node N2 through the fifth transistor T5 and the seventh transistor T7. At this time, the signal of the second node N2 is high level, and then the sixth transistor T6 and the ninth transistor T9 are turned off. The first voltage signal VEE is transmitted to the second end of the second capacitor C2 through the tenth transistor T10 and the twelfth transistor T12, and the second capacitor C2 is charged. The signal of the third node N3 is low potential, and then the fourth transistor T4 and the eighth transistor T8 are turned on. The second voltage signal VDD is transmitted to the first end of the first capacitor C1 through the eighth transistor T8. Under the action of the third capacitor C3, the fourth node N4 is still at a low level, then the sixteenth transistor T16 is turned on, and the second voltage signal VDD is transmitted to the output end through the sixteenth transistor T16, and at this time, the output end outputs a high-level signal VDD.

Figure 9:
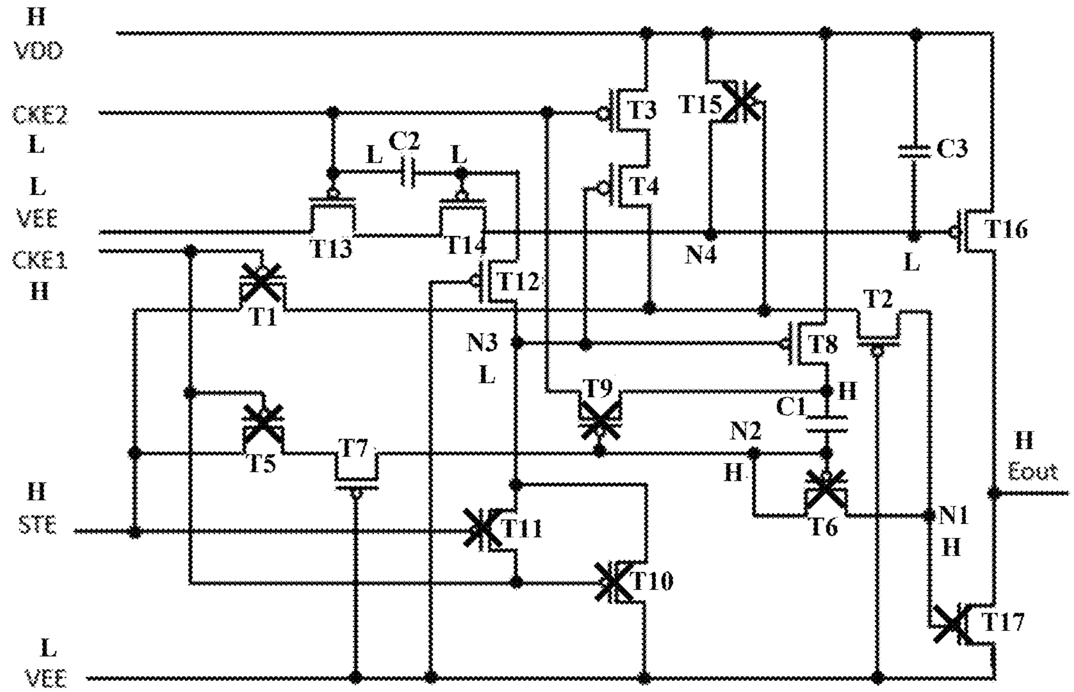

FIG. 9 shows a schematic diagram of controlling the on/off of the circuit in the shift register unit during the fourth step of operation Step4. As shown in FIG. 9, during the operation of Step4, the input signal STE is high level, the first clock signal CKE1 is high level, and the second clock signal CKE2 is low level. The operating principle of the fourth step Step4 is the same as that of the second step Step2. The on-off conditions of the circuits in the shift register unit are the same and will not be described again here. Therefore, during the operation of Step4, the sixteenth transistor T16 is turned on, and the output end of the shift register unit outputs the high-level second voltage signal VDD.

Figure 10:
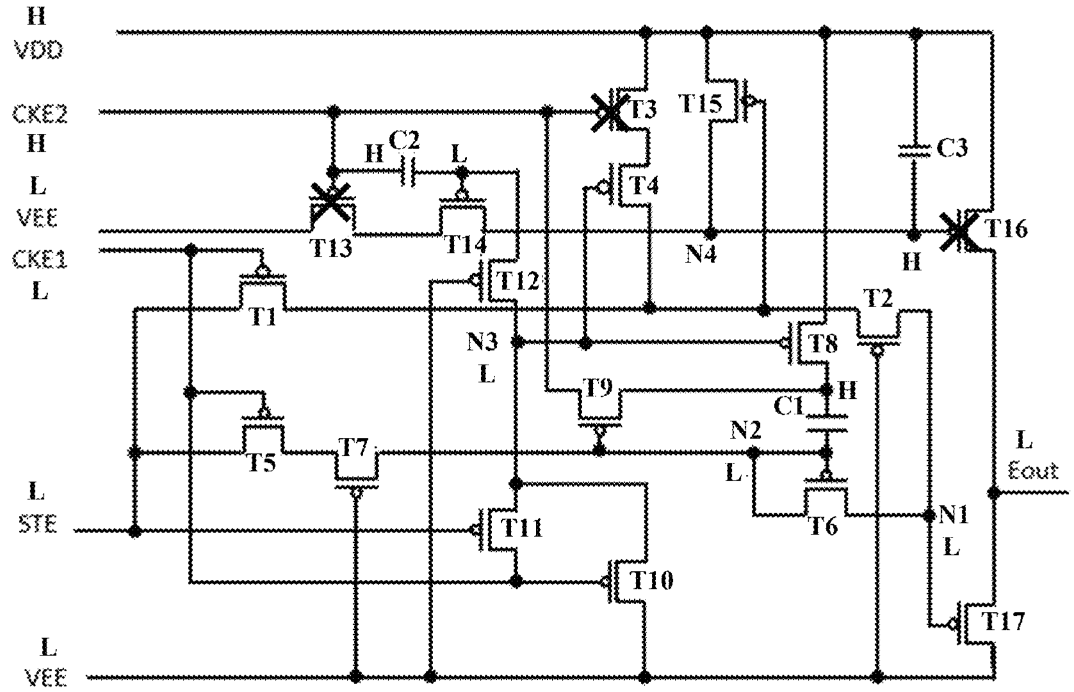

FIG. 10 shows a schematic diagram of controlling the on/off of the circuit in the shift register unit during the fifth step of operation Step5. As shown in FIG. 10, during the operation of Step5, the input signal STE is low level, the first clock signal CKE1 is low level, and the second clock signal CKE2 is high level, then the first transistor T1, the fifth transistor T5, The seventh transistor T7, the tenth transistor T10, and the eleventh transistor T11 are turned on, and the third transistor T3 and the thirteenth transistor T13 are turned off. The input signal STE is transmitted to the first node N1 through the first transistor T1 and the second transistor T2, and the first node N1 is low level at this time. Under the action of the first node N1 being at the low level, the fifteenth transistor T15 and the seventeenth transistor T17 are turned on. The second voltage signal VDD is transmitted to the fourth node N4 through the fifteenth transistor T15. Under the action of the fourth node N4 being the high-level signal VDD, the sixteenth transistor T16 is turned off. The input signal STE is transmitted to the second node N2 through the fifth transistor T5 and the seventh transistor T7. The second node N2 is a low-level signal, and the sixth transistor T6 and the ninth transistor T9 are turned on under the action of the second node N2. At this time, the second node N2 can transmit a signal to the first node N1 through the sixth transistor T6, and the second clock signal CKE2 can transmit to the first end of the first capacitor C1 through the ninth transistor T9. The first voltage signal VEE is transmitted to the second end of the second capacitor C2 through the tenth transistor T10 and the twelfth transistor T12. The second end of the second capacitor C2 is connected to the third node N3. At this time, the third node N3 is low level. Under the action of the third node N3 being at the low level, the fourth transistor T4 and the eighth transistor T8 are turned on, and the second voltage signal VDD is transmitted to the first end of the first capacitor C1 through the eighth transistor T8. The second capacitor C2 is charged under the action of the second clock signal lead and the third node N3. The first capacitor C1 is charged under the action of the second node N2, the second clock signal CKE2, and the second voltage signal VDD. In the fifth step operation Step5, the first voltage signal VEE is transmitted to the output end through the seventeenth transistor T17, and the signal output Eout at the output end is the low-level signal VEE. The first node N1 is connected through the first transistor T1, the second transistor T2, the fifth transistor T5, the sixth transistor T6 and the seventh transistor T7, and changes from the high level of the operation step Step4 to the low level of the operation step Step5. Under the action of the low level of the first node N1, the seventeenth transistor T17 is turned on, and the output signal Eout changes from the high level in Step4 to the low level in Step5. Because a parasitic capacitance exists between the seventeenth transistor T17 and the first node N1, when the output signal Eout changes from high level to low level, by the coupling effect of the capacitor, the potential of the first node N1 is coupled to a lower level, about (Vgh−Vgl), at this time $Vgs_{T17} \ll Vth_{T17}$, $Vds_{T17}$ is close to 0V, and the output signal Eout outputs VEE low level, which solves the problem of output step in the existing technology.

Figure 11:
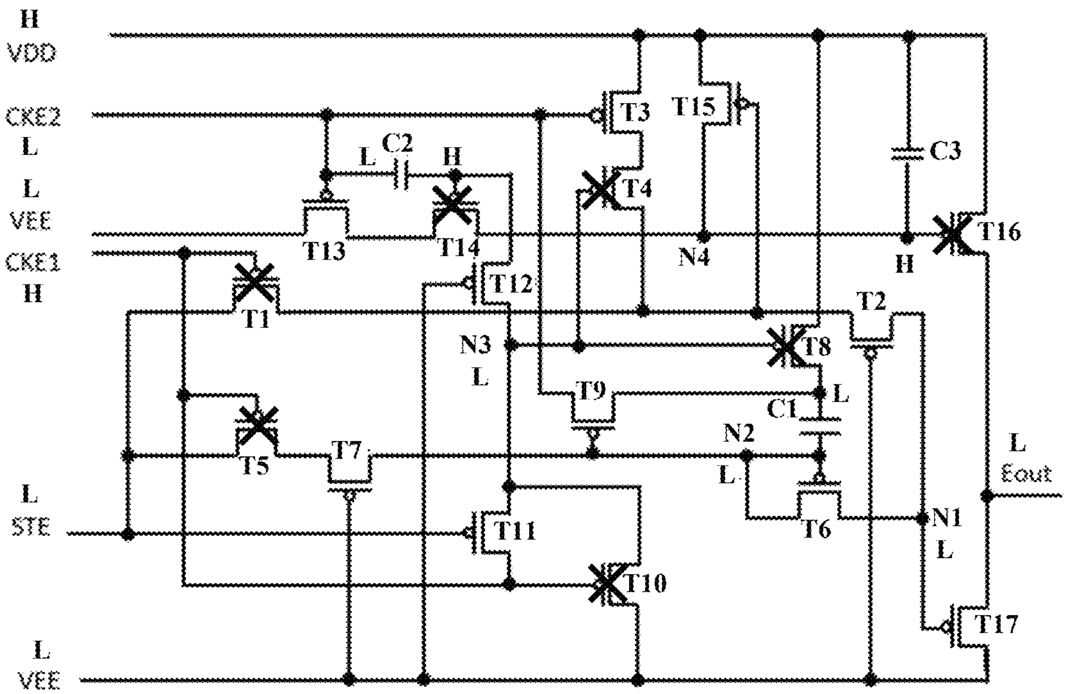

FIG. 11 shows the operating equivalent diagram of the shift register unit when operating in the sixth step Step6. At this time, the first clock signal CKE1 is a high-level signal, the second clock signal CKE2 is a low-level signal, and the input signal STE is a low-level signal, then the first transistor T1, the fifth transistor T5, and the tenth transistor T10 are turned off, and the eleventh transistor T11 and the thirteenth transistor T13 are turned on. At this moment, the first clock signal CKE1 is transmitted to the third node N3 through the eleventh transistor T11, and is transmitted to the second end of the second capacitor C2 through the twelfth transistor T12. At this time, the signal of the third node N3 is high level signal, and then the fourth transistor T4, the eighth transistor T8 and the fourteenth transistor T14 are turned off. Under the action of the second clock signal CKE2 and the third node N3, the second capacitor C2 is charged. Under the action of the first capacitor C1, the signal of the second node N2 is low level, the ninth transistor T9 and the sixth transistor T6 are turned on, and the second clock signal CKE2 is transmitted to the first end of the first capacitor C1 through the ninth transistor T9. Under the action of capacitive coupling, the potential of the second node N2 will further decrease, and the potential of the second node N2 is transmitted to the first node N1 through the sixth transistor T6, and the seventeenth transistor T17 is turned on. Therefore, in the sixth step Step6, the first voltage signal VEE is transmitted to the output end through the seventeenth transistor T17, and the output signal Eout at the output end is the low-level signal VEE. Under the action of the first capacitor C1, the potential of the second node N2 is pulled down. The sixth transistor T6 is turned on, which causes the potential of the first node N1 and the second node N2 to be balanced. Under the action of the second node N2, the potential of the first node N1 will be further pulled down and continue to decrease over time, and the potential will gradually decrease.

The shift register unit repeats the fifth step Step5 and the sixth step Step6 in subsequent operating steps, which will not be described again here, until the input signal STE appears at a high level, and then re-enters the next cycle and performs the operation step of Step1.

The shift register unit, gate driving circuit and display device provided by the present disclosure have the following advantages:

The shift register unit includes an input module, a first control module, a second control module, a first output module, a second output module, a first capacitor, a second capacitor and a third capacitor; wherein the input module controls the potential of the first node and the second node, the first control module controls the potential of the third node, the second control module controls the potential of the fourth node, the first capacitor is connected between the second node and the second voltage signal lead; the first node and the second node are connected through a switch transistor; the second capacitor is connected between the third node and the second clock signal lead; the third capacitor is connected between the fourth node and the second voltage signal lead. By optimizing the output waveform of the first node, the response time of the output signal waveform of the shift register unit is reduced when switching between high and low potentials, and the pixel circuit controlled by the shift register unit is turned off in a timely manner.

Figure 12:
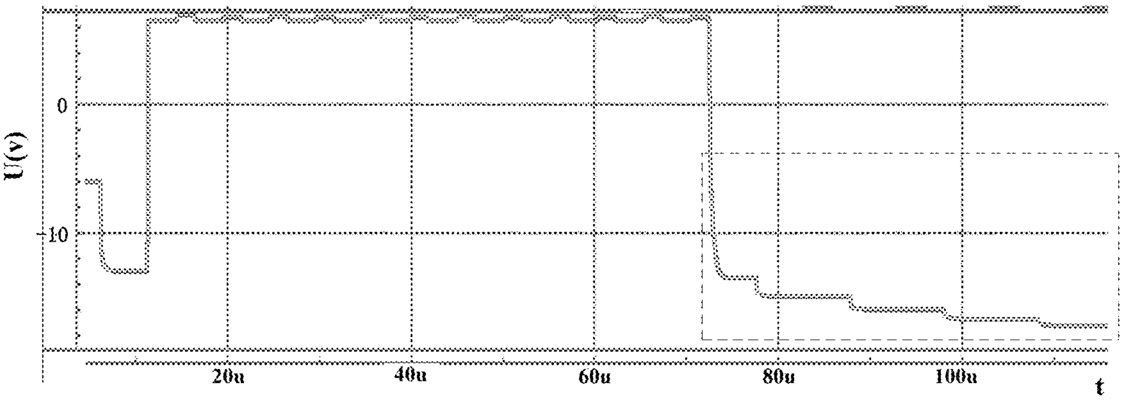
FIG. 12 is a voltage output waveform diagram of the first node N1 of the shift register unit according to an embodiment of the present disclosure.

In order to further study the technical effects achieved by the shift register unit provided by the embodiment of the present disclosure, a simulation experiment was used to test the voltage waveform diagram of the first node N1 during operation. FIG. 12 shows the voltage waveform diagram of the first node N1 during operation. As shown in FIG. 12, when the output of the shift register unit transitions from a high-level signal to a low-level signal (the dotted box shown in FIG. 12), no obvious high or low oscillation waveform appears, and it is a continuous low-level waveform.

Figure 13:
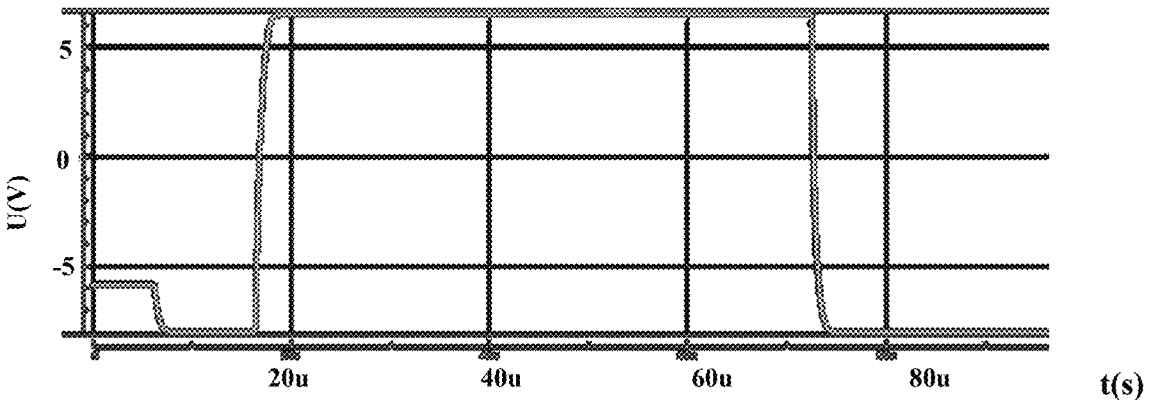
FIG. 13 is a voltage output waveform diagram of the output end of the shift register unit according to an embodiment of the present disclosure.

Further, FIG. 13 shows a voltage waveform diagram output by the output end of the shift register unit provided by the embodiment of the present disclosure. As shown in FIG. 13, when the output signal transitions from high potential to low potential, there is no obvious step. Therefore, the shift register unit provided by the present disclosure can reduce the response time of high and low voltage conversion, promptly turn off the pixel circuit controlled by the shift register unit, and make the pixel unit controlled by the pixel circuit charge and discharge uniformly.

Figure 14:
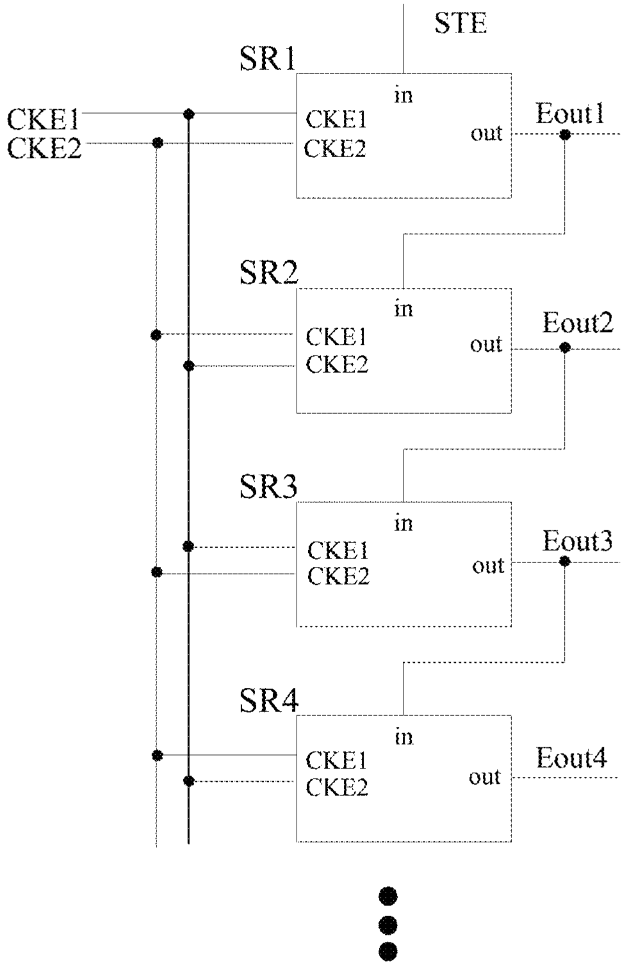
FIG. 14 is a schematic diagram of a gate driving circuit according to an embodiment of the present disclosure.

Specifically, in FIG. 14, four cascaded shift register units are taken as an example. The input signal STE at the input end in of the first-stage shift register unit SR1 is the start pulse signal. The output signal Eout1 of the output end out of the first-stage shift register unit SR1 serves as the input signal of the second-stage shift register unit SR2. The output end out of the first-stage shift register unit SR1 is connected to the input end in of the second-stage shift register unit SR2. The output signal Eout2 of the second stage shift register unit SR2 serves as the input signal of the third-stage shift register unit SR3, and the output end out of the second-stage shift register unit SR2 is connected to the input end in of the third-stage shift register unit SR. The output signal Eout3 of the third-stage shift register unit SR3 serves as the input signal of the fourth-stage shift register unit SR4, and the output end out of the third-stage shift register unit SR3 is connected to the input end in of the fourth-stage shift register unit SR4 . . . , and the gate driving circuit is formed by repeating the above.

As shown in FIG. 14, the gate driving circuit further includes a clock signal generating unit (not shown in the figure). The clock signal generating unit is used to generate the first clock signal CKE1 and the second clock signal CKE2. Specifically, the first clock signal CKE1 and the second clock signal CKE2 in the first-stage shift register unit SR1 are respectively the first clock signal CKE1 and the second clock signal CKE2 generated by the clock signal generating unit; the first clock signal CKE1 and the second clock signal CKE2 in the second-stage shift register unit SR2 are respectively the second clock signal CKE2 and the first clock signal CKE1 generated by the clock signal unit; the first clock signal CKE1 and the second clock signal CKE2 in the third-stage shift register unit SR3 are respectively the first clock signal CKE1 and the second clock signal CKE2 generated by the clock signal unit; the first clock signal CKE1 and the second clock signal CKE2 in the fourth-stage shift register unit SR4 are respectively the clock signal CKE1 and the second clock signal CKE2 generated by the clock signal unit, etc., the first clock signal CKE1 and the second clock signal CKE2 in the n-th stage shift register unit SRn are respectively the first clock signal CKE1 and the second clock signal CKE2 generated by the clock signal unit, and the first clock signal CKE1 and the second clock signal CKE2 in the (n+1)th stage shift register unit SRn+1 are respectively the second clock signal CKE2 and the first clock signal CKE1 generated by the clock signal generating unit.

Figure 15:
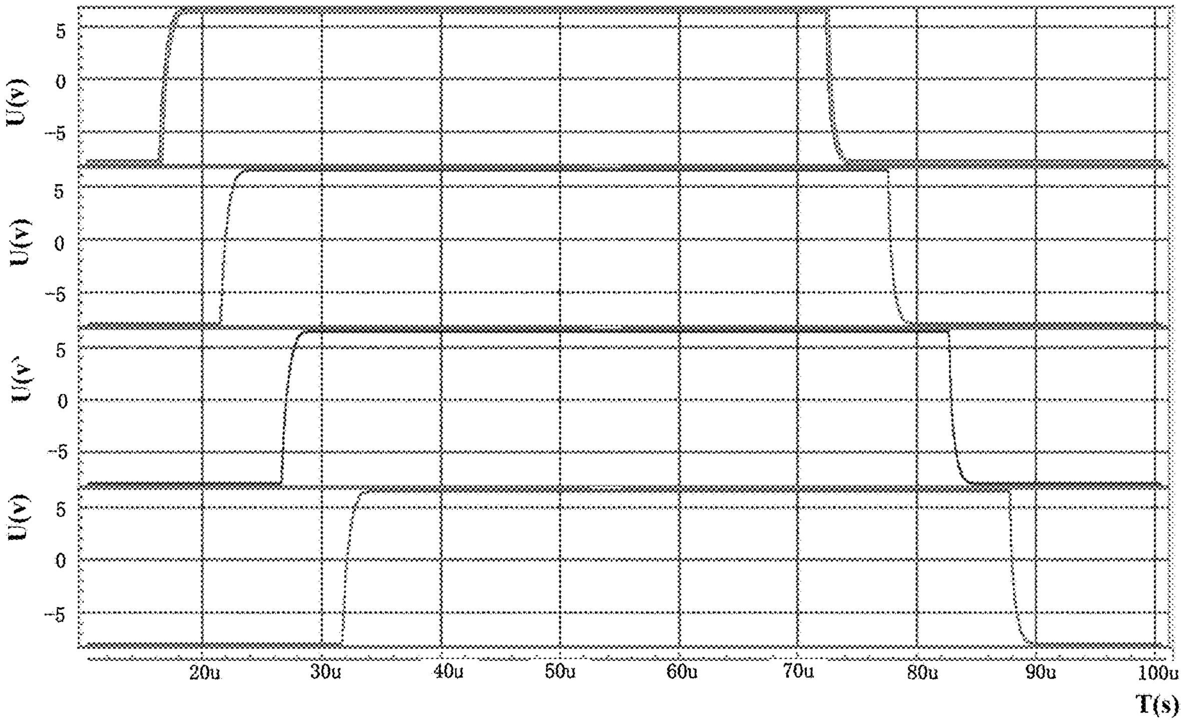
FIG. 15 is an output waveform diagram of the gate driving circuit according to an embodiment of the present disclosure.

FIG. 15 shows an output signal waveform diagram of the four-stage shift register unit in the gate driving circuit shown in FIG. 14. As shown in FIG. 15, the voltage waveform output of the four-stage shift register unit is normal and effectively output, and no obvious steps appear when performing high and low potential conversion, which reduces the high and low potential conversion response time, so that the pixel circuit controlled by the shift register unit can be turned off in time, thereby improving the uniformity of charging and discharging of the pixel unit controlled by the pixel circuit.

The embodiment of the present disclosure further provides a display device, comprising the gate driving circuit as described above, and using the signal output from the shift register unit to turn on the gate scan lines in the display device row by row, that is, the signal output from the output signal end of each shift register unit is the gate scan line signal of each row of pixel units. Further, the display device further includes a source driving circuit for providing a data voltage to the corresponding pixel unit when the gate scan line is turned on.

Figure 16:
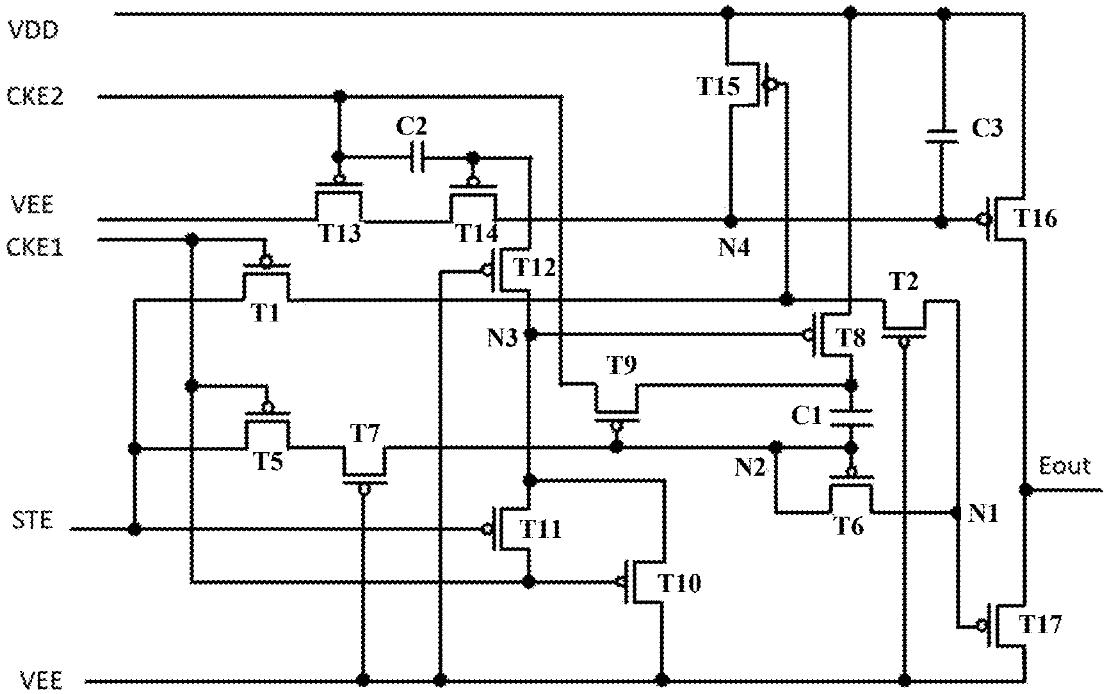
FIG. 16 is a schematic diagram of a shift register unit according to another embodiment of the present disclosure.

As shown in FIG. 16, another embodiment of the present disclosure provides a shift register unit. Compared with the shift register unit shown in FIG. 4, the shift register unit in FIG. 16 eliminates the transistor T3 and the fourth transistor T4, but can achieve the same technical effect as the shift register unit in the embodiment of FIG. 4, while due to the reduction in the number of transistors in the shift register unit, the circuit layout area is reduced, thereby reducing the size of the display frame and achieving a narrow frame effect of the display device.

The shift register unit, gate driving circuit and display device provided by the present disclosure have the following advantages:

By optimizing the output waveform of the first node, the response time of the output signal waveform of the shift register unit is reduced when switching between high and low potentials, and the pixel circuit controlled by the shift register unit is turned off in a timely manner.

The above content is a further detailed description of the present disclosure in combination with specific preferred embodiments, and it cannot be concluded that the specific implementation of the present disclosure is limited to these descriptions. For those of ordinary skill in the technical field to which the present disclosure belongs, several simple deductions or substitutions can be made without departing from the concept of the present disclosure, and all of which should be regarded as belonging to the protection scope of the present disclosure.

What is claimed is:

1. A shift register unit, comprising:

an input circuit, configured to transmit an input signal of an input end to a first node and a second node in response to a first clock signal;

a first control circuit, configured to transmit a first voltage signal to a third node in response to the first clock signal; and transmit the first clock signal to the third node in response to a signal of the input end;

a second control circuit configured to transmit the first voltage signal to a fourth node in response to a second clock signal; and transmit a second voltage signal to the fourth node in response to a signal of the first node;

a first output circuit, configured to transmit the second voltage signal to the output end in response to a signal of the fourth node;

a second output circuit, configured to transmit the first voltage signal to the output end in response to the signal of the first node;

a first capacitor, connected between the second node and a second voltage signal lead; the first node and the second node are connected through a switch transistor;

a second capacitor, connected between the third node and a second clock signal lead; and a third capacitor, connected between the fourth node and the second voltage signal lead.

2. The shift register unit according to claim 1, wherein the input circuit comprises a first transistor and a second transistor, a control end of the first transistor is connected to a first clock signal lead, a first end of the first transistor is connected to the input end, and a second end of the first transistor is connected to a first end of the second transistor; and a control end of the second transistor is connected to a first voltage signal lead, and the second end of the second transistor is connected to the first node.

3. The shift register unit according to claim 2, wherein the input circuit further comprises a third transistor and a fourth transistor, a control end of the third transistor is connected to the second clock signal lead, a first end of the third transistor is connected to the second voltage signal lead, and a second end of the third transistor is connected to a first end of the fourth transistor; and a control end of the fourth transistor is connected to the third node, and a second end of the fourth transistor is connected to the first end of the second transistor.

4. The shift register unit according to claim 2, wherein the input circuit further comprises a fifth transistor and a sixth transistor, the switch transistor is the sixth transistor, a control end of the fifth transistor is connected to the first clock signal lead, a first end of the fifth transistor is connected to the input end, and the second end of the fifth transistor is connected to the second node; and a control end of the sixth transistor is connected to the second node, a first end of the sixth transistor is connected to the second node, and a second end of the sixth transistor is connected to the first node.

5. The shift register unit according to claim 4, wherein the input circuit further comprises a seventh transistor, a control end of the seventh transistor is connected to the first voltage signal lead, a first end of the seventh transistor is connected to the second end of the fifth transistor, and a second end of the seventh transistor is connected to the second node.

6. The shift register unit according to claim 4, wherein the input circuit further comprises an eighth transistor, a control end of the eighth transistor is connected to the third node, a first end of the eighth transistor is connected to the second voltage signal lead, and a second end of the eighth transistor is connected to a first end of the first capacitor.

7. The shift register unit according to claim 6, wherein the input circuit further comprises a ninth transistor, a control end of the ninth transistor is connected to the second node, a first end of the ninth transistor is connected to the second clock signal lead, and a second end of the ninth transistor is connected to the first end of the first capacitor.

8. The shift register unit according to claim 6, wherein the first control circuit comprises a tenth transistor, a control end of the tenth transistor is connected to the first clock signal lead, a first end of the tenth transistor is connected to the first voltage signal lead, and a second end of the tenth transistor is connected to the third node.

9. The shift register unit according to claim 8, wherein the first control circuit further comprises an eleventh transistor, a control end of the eleventh transistor is connected to the input end, a first end of the eleventh transistor is connected to the first clock signal lead, and a second end of the eleventh transistor is connected to the third node.

10. The shift register unit according to claim 9, wherein the first control circuit further comprises a twelfth transistor, a control end of the twelfth transistor is connected to the first voltage signal lead, a first end of the twelfth transistor is connected to the third node, and a second end of the twelfth transistor is connected to a second end of the second capacitor.

11. The shift register unit according to claim 9, wherein the second control circuit comprises a thirteenth transistor and a fourteenth transistor, a control end of the thirteenth transistor is connected to a first end of the second capacitor and is connected to the second clock signal lead, a first end of the thirteenth transistor is connected to the first voltage signal lead, and a second end of the thirteenth transistor is connected to a first end of the fourteenth transistor; and a control end of the fourteenth transistor is connected to a second end of the second capacitor, and a second end of the fourteenth transistor is connected to the fourth node.

12. The shift register unit according to claim 11, wherein the second control circuit further comprises a fifteenth transistor, a control end of the fifteenth transistor is connected to the first node, a first end of the fifteenth transistor is connected to the second voltage signal lead, and a second end of the fifteenth transistor is connected to the fourth node.

13. The shift register unit according to claim 1, wherein the first output circuit comprises a sixteenth transistor, a control end of the sixteenth transistor is connected to the fourth node, a first end of the sixteenth transistor is connected to the second voltage signal lead, and a second end of the sixteenth transistor is connected to the output end; and the second output circuit comprises a seventeenth transistor, a control end of the seventeenth transistor is connected to the first node, a first end of the seventeenth transistor is connected to a first voltage signal lead, and a second end of the seventeen transistors is connected to the output end.

14. A gate driving circuit, comprising the shift register unit according to claim 1.

15. A display device, comprising the gate driving circuit according to claim 14.

* * * * *